(12) United States Patent
Dickey et al.

(10) Patent No.: US 7,183,959 B1
(45) Date of Patent: Feb. 27, 2007

(54) METHOD AND SYSTEM FOR IMPLEMENTING A REDUCED LATENCY, WIDEBAND PULSE DENSITY MODULATION DIGITAL TO ANALOG CONVERTER

(75) Inventors: John A. Dickey, Chandler, AZ (US); Paul B. DuPuis, Glendale, AZ (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/292,180

(22) Filed: Nov. 30, 2005

(51) Int. Cl.
*H03M 1/82* (2006.01)
(52) U.S. Cl. ...................................... 341/152; 375/239
(58) Field of Classification Search ................ 341/152, 341/144; 375/239, 240, 238
See application file for complete search history.

(56) References Cited

U.S. PATENT DOCUMENTS

| | | | |
|---|---|---|---|
| 3,603,977 A | 9/1971 | Szabo et al. ................. 341/152 |
| 5,053,769 A | 10/1991 | Landmann .................... 341/53 |
| 5,337,338 A | 8/1994 | Sutton et al. ................. 377/33 |
| 5,481,560 A | 1/1996 | Potetz et al. ................. 375/238 |
| 5,995,546 A * | 11/1999 | Richardson ................. 375/237 |
| 6,281,822 B1 | 8/2001 | Park .......................... 341/144 |
| 6,366,611 B1 * | 4/2002 | Park .......................... 375/229 |
| 6,396,317 B1 | 5/2002 | Roller et al. ................ 327/113 |
| 2003/0123581 A1 | 7/2003 | Kim ................................ 435/4 |
| 2003/0174005 A1 | 9/2003 | Latham, II et al. ......... 327/172 |
| 2004/0222866 A1 | 11/2004 | Stengel et al. .............. 332/109 |

* cited by examiner

*Primary Examiner*—Peguy JeanPierre
(74) *Attorney, Agent, or Firm*—Ingrassia Fisher & Lorenz, P.C.

(57) ABSTRACT

According to one aspect of the present invention, this invention implements a low latency, wide bandwidth method and system for converting a numeric digital values into a pulse density modulated analog output signals. Such output signals having their lowest output frequency much closer to the system clock frequency, thus enabling wider bandwidth and simpler implementations than with traditional approaches. This method is based in part on an adaptation of Bresenham's Line Drawing Algorithm.

20 Claims, 6 Drawing Sheets

A=179    $2^n$ = 256    B= -77

| SEQUENTIAL CLOCK CYCLE | SELECTED VALUE | ACCUMULATOR RUNNING TOTAL | OUTPUT PULSE VALUE |
|---|---|---|---|
| 1 | 179 | 136 | 1 |
| 2 | -77 | 59 | 1 |
| 3 | -77 | -18 | 0 |
| 4 | 179 | 161 | 1 |
| 5 | -77 | 84 | 1 |
| 6 | -77 | 7 | 1 |
| 7 | -77 | -70 | 0 |
| 8 | 179 | 109 | 1 |
| 9 | -77 | 32 | 1 |
| 10 | -77 | -45 | 0 |
| 11 | 179 | 134 | 1 |
| 12 | -77 | 57 | 1 |
| 13 | -77 | -20 | 0 |
| 14 | 179 | 159 | 1 |
| 15 | -77 | 82 | 1 |
| 16 | -77 | 5 | 1 |

FIG. 3

METHOD AND SYSTEM FOR IMPLEMENTING A REDUCED LATENCY, WIDEBAND PULSE DENSITY MODULATION DIGITAL TO ANALOG CONVERTER

TECHNICAL FIELD

The present invention generally relates to a method and system for converting a digital signal into a pulse modulation signal, and more particularly relates to a method for converting a digital signal into a pulse density or pulse distribution modulation (PDM) signal using an algorithm that has been widely used to draw lines.

BACKGROUND

Many electrical circuits used in a wide variety of modern technologies require both digital and analog circuitry. In order to convert between analog signals and digital signals, and vice versa, many circuits include both analog-to-digital and digital-to-analog converters. One common method used to convert between analog signals and digital signals is known as pulse distribution, or density, modulation (PDM).

When converting a digital signal to an analog signals, PDM involves receiving a multi-bit parallel digital input signal and converting the digital input to a binary output signal consisting of a series of 1's and 0's. Each 1 or 0 is generated at a frequency set by a clock signal. In order to convert the PDM signal back into an analog signal, a low pass filter is often used which essentially "averages" the values of the series of 1's and 0's into an analog signal.

Typically, the ratio of the clock frequency to the pulse rate is very high, such as 1000 to 1. As a result, the useable bandwidth is usually several orders of magnitude lower than the clock frequency.

Accordingly, it is desirable to provide a method for generating a PDM signal in which the ratio of the system clock frequency to the fundamental frequency of the output PDM signal can be reduced. Furthermore, other desirable features and characteristics of the present invention will become apparent from the subsequent detailed description and the appended claims, taken in conjunction with the accompanying drawings and the foregoing technical field and background.

BRIEF SUMMARY

A method is provided for converting a digital signal into a pulse density modulation signal. The method comprises receiving a digital input signal representative of a first number, calculating a difference between the first number and a predetermined number to obtain a second number, the predetermined number being equal to a numeric value that defines the temporal resolution of the conversion, calculating a running summation at each clock cycle of the first and second numbers, the summation having either a positive or a negative numeric sign, and generating a portion of a pulse density modulation signal based, in part, on the changing numeric sign of the summation.

BRIEF DESCRIPTION OF THE DRAWINGS

The present invention will hereinafter be described in conjunction with the following drawing figures, wherein like numerals denote like elements.

FIG. 3 is a table depicting an example latch state sequence using n=8, for the method and/or system illustrated in FIG. 1;

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. It should also be noted that FIGS. 1–6 are merely illustrative and graphical figures may not be drawn to scale.

FIG. 1 to FIG. 5 illustrate a method and system for converting a digital signal into a pulse density, or distribution, modulation (PDM) signal that, when averaged, represents the ratio of the numeric digital input signal (i.e., the numerator) to the maximum two's complement numeric value that the latch is capable of attaining (this becomes the denominator). A digital input word having a first numeric value is received, along with a clock signal. A second numeric value is calculated at each clock input by determining a difference between the numeric value of the input digital word and the predefined numeric value representing the temporal resolution of for the PDM signal. An integrating summation of a series of the first and second numbers is kept in which, at each clock input, the first number is added to the summation if the value of the summation is negative and the second number is added to the summation if the value of the summation is positive. An output state is generated at each clock input. The temporal distribution of the output states constitutes the PDM output signal. The output state has a first value if the value of the summation is positive and a second value if the value of the summation is negative. The method may utilize Bresenham's Line Drawing Algorithm in converting the digital signal to the PDM signal. This method directly implements a digital to analog converter. The method and system may also be utilized with a feedback loop to implement an analog-to-digital signal converter as depicted in FIG. 6.

Figure 1:
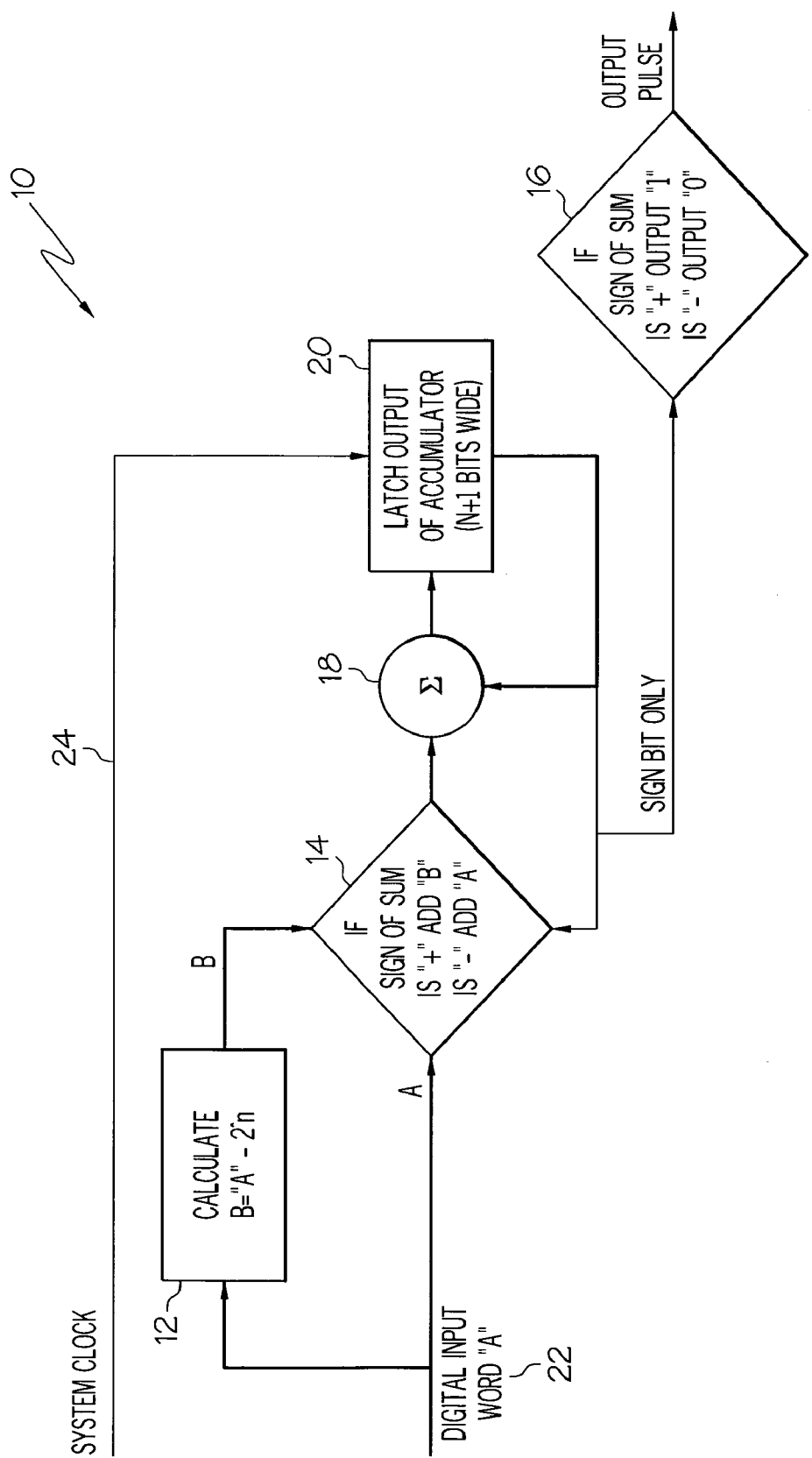
FIG. 1 is a flow chart illustrating a method and/or system for converting a numeric digital signal into a pulse density modulated analog output signal.

FIG. 1 illustrates a method and/or system 10 for converting a digital signal into a PDM signal, according to one embodiment of the present invention. The system 10 includes a data calculator 12, a first data selector 14, a second data selector 16, an accumulator 18, and a data storage device 20. As will be appreciated by one skilled in the art, the system 10 illustrated in FIG. 1 may be implemented in whole or in part using electronic components, including various circuitry and integrated circuits, such as an Application Specific Integration Circuit (ASIC), a Field Programmable Gate Array (FPGA), or with software or firmware based instructions stored on a computer readable medium to be executed by a computing system.

As shown in FIG. 1, a digital input word "A" 22, is received by the data calculator 12 and the first data selector 14. As indicated, the data calculator calculates a value "B," where $B=A-2^n$ where n is the width of the register in bits corresponding to $2^n$ possible numeric values. It should be noted that in the preferred embodiment, this register should have N+1 bits corresponding to $2^{n+1}$ numeric states as discussed later. Both A and B are sent to the first data selector 14 which conditionally directs either A or B to the accumulator 18. Accumulator 18 keeps a running summation of the values of A and B that are sent from the first data selector 14. That is, either A or B is sent to the accumulator, which adds the sent value (either A or B) to the summation (i.e., "running total").

The current summation of the A and B values with the previous accumulator data storage result is then sent from the accumulator 18 to the data storage element 20. The data storage 20 may be implemented with a hardware "latch" or other storage means that will retain the accumulator's output data upon reception of a system clock signal 24. Therefore, in the example illustrated in FIG. 1, the latch 20 updates its value with every cycle of the system clock signal 24. The clock forces the accumulator's carry bit state-controlled running summation to update instantaneously with each clock. In this example, the number of temporal states possible is 256 (i.e., $2^8$). Additionally, the storage capacity of the latch 20 is preferably one bit larger than the modulus of the counter (n+1), or in some cases two bits larger (n+2), to accommodate the extra bit needed to maintain the sign bit when the counter value is at its negative maximum and/or to constrain the operational duty cycle between specific limits as discussed later.

As shown in FIG. 1, the stored value is sent back into the accumulator 18, while the sign bit of the stored value (i.e., the bit representative of either positive (+) or negative (−)) is sent to the first data selector 14 and the second data selector 16. If the current stored value in the latch 20 is positive, the first data selector 14 selects value B, which is then added to the current stored value by the accumulator 18 and sent to the latch 20. If the current stored value in the latch 20 is negative, the first data selector 14 selects value A (i.e., the digital input word), which is then added to the current stored value by the accumulator 18 and sent to the latch 20. The second data selector 16 outputs either a "1" or a "0" based on the sign bit of the current stored value in the latch 20. If the sign bit of the current stored value is positive, the second data selector 16 selects outputs a 1. Likewise, if the sign bit of the current stored value is negative, the second data selector 16 outputs a 0.

The process described above is repeated continuously with each clock cycle of the system clock such that a pulse distribution modulation (PDM) signal is generated from the 1's and 0's output from the second data selector 16. As will be appreciated by one skilled in the art, the process described above for converting the digital input word into a PDM signal is based on Bresenham's Line Drawing Algorithm. For completeness, a brief description of this particular algorithm will now be discussed.

Figure 2:
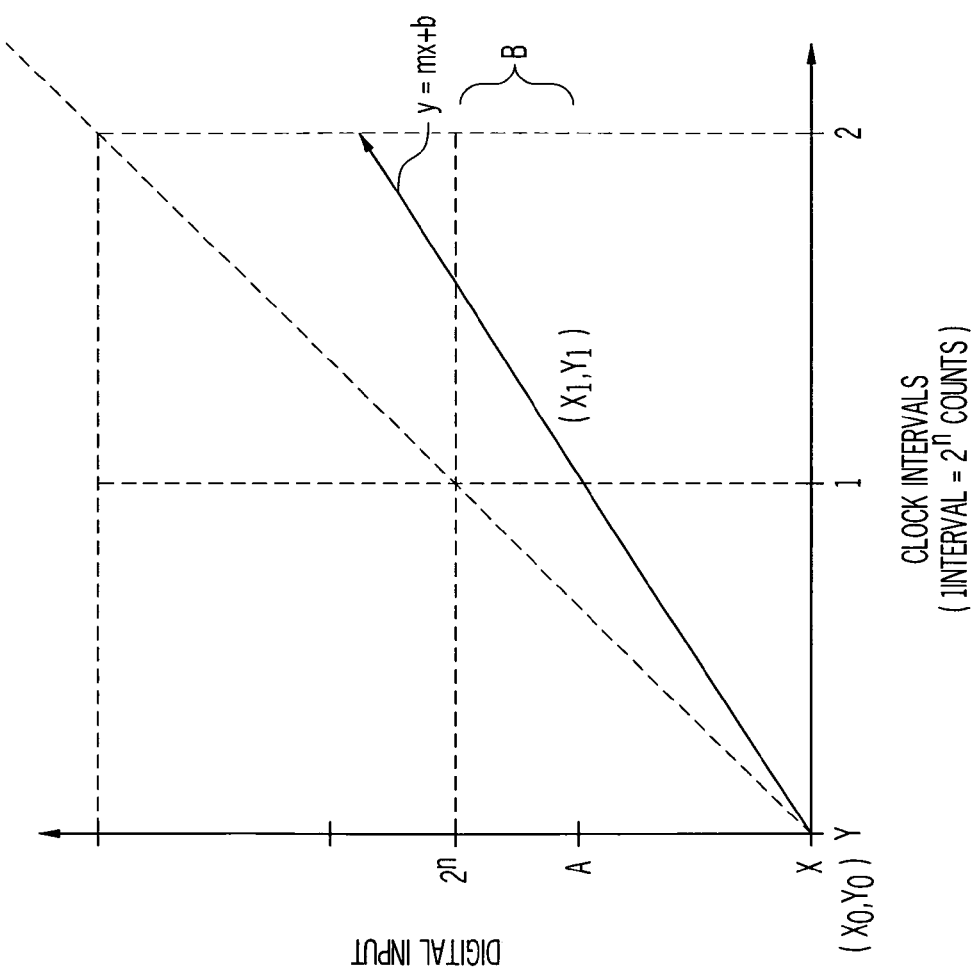
FIG. 2 is a graphical illustration of a Bresenham Algorithm vector corresponding to a digital input.

FIG. 2 is a graphical illustration of the use of Bresenham's Line Drawing Algorithm in relation to the digital input word A. Generally speaking, Bresenham's Line Drawing Algorithm determines which points (or pixels) on a two-dimensional raster, or two-dimensional Cartesian coordinate system using only integers, should be plotted in order to approximate a straight line between two given points. For instance, as shown in FIG. 2, a line between $(x_0, y_0)$ and $(x_1, y_1)$ can be represented by the equation y=mx+b, where m is the slope of the line. It is generally assumed that the slope of the line is between 0 and 1 such that the y-value never increases by more than one pixel and the x-value is constantly increasing. As is commonly understood in the art, Bresenham's Line Drawing Algorithm keeps track of the error that accumulates in y, or the difference between the currently plotted y and the "true" value of y. The error is generally initialized with a value of zero because the initial point, $(x_0, y_0)$, is exact. As the line progresses from left-to-right (i.e., as x increases), y is incremented by 1 only when the accumulated y-error becomes greater than 0.5. The y-error thus keeps track of the difference between the currently plotted y, and the "true" value of y.

Referring now to FIG. 1 in combination with FIG. 2, a similar line may be considered on the two-dimensional raster with the points on the x-axis representing the temporal states and the y-axis representing the digital input word A. There are $2^n$ possible temporal states, therefore, each digital input word must be constrained between a numeric value of zero and $2^n$. Therefore, the value B is the difference between a particular digital word A and the number of temporal states possible. In FIG. 2, B may be understood to represent the distance between the points (1,A) and (1, $2^n$), or the y-error as described above. The method and/or system 10 illustrated in FIG. 1 tracks this error similarly to Bresenham's Line Drawing Algorithm.

Relating this to the line drawing algorithm the A value is equivalent to the Y length of the line segment to draw and the period $2^n$ is equivalent to the X length of the line segment. Each clock cycle is equivalent to making one step along the X axis and either 0 or 1 steps at the same time along the Y axis, thereby drawing an incremental step either to the right or up at a 45 degree angle to the upper right. The invention equivalent is that the X axis or Time increases at every clock sample and the output pulse is high if the line segment would have gone up and right or low if the line segment would have only gone to the right. The clock cycle is the basic unit of measure or resolution or sample size that everything is measured with. In digital plotters "A" may represent 0.01 inch as a "Y" axis step size whereas in this implementation A represents the minimum output voltage step for a minimum incremental count input.

FIG. 3 is a table illustrating an example of a particular digital input word being processed into a series of 1's and 0's constituting the output PDM signal, using the method and/or system 10 illustrated in FIG. 1. As shown, the digital input word (e.g., A or primary addend) in the example shown has a numeric value of 179, and the total number of temporal states is 256 (i.e., n=8). Thus, B (i.e., $A-2^n$) has a value of −77. Referring to FIG. 1 in combination with FIG. 3, the digital input word is first sent to both the data calculator 12 and the first data selector 14.

As indicated in FIG. 3, a current stored value, or accumulator running total, may already be stored in the latch 20 at the first averaging period. As will be appreciated by one skilled in the art, the current stored value may be a remainder from the processing of a previous digital input word, which may be different from 179. In the example shown, the current stored value is 136. Therefore, the sign bit sent to the second data selector 16 is representative of a positive value, and the output thereof is a 1. Furthermore, because the selected value is 179, it may thus be deduced in the example shown, that the previous stored value was negative and the value A was chosen by the first data selector 14.

As previously mentioned, referring to FIG. 1 and FIG. 3, at the first averaging cycle the current stored value is also sent to the accumulator 18 and the first data selector 14.

Because the current stored value is positive, the first data selector 14 selects B to be sent to the accumulator 18, which adds −77 to the current stored value of 136, resulting in the current stored value becoming 59. The current stored value is sent to the latch 20, which updates itself at every clock interval. The sign bit (e.g., positive) of 59 is then sent to the second data selector 16, which thus outputs a 1.

During the next averaging period, because the current stored value is positive, again the value B of −77 is selected by the first data selector 14 to be sent and added to the current stored value, which results in the current stored value becoming −18. Thus, the second data selector outputs a 0. As shown in FIG. 3, this process is repeated causing the second data selector 16 to generate a series of 1's and 0's, with each 1 or 0 being held for one or more periods of the system clock.

Figure 4:
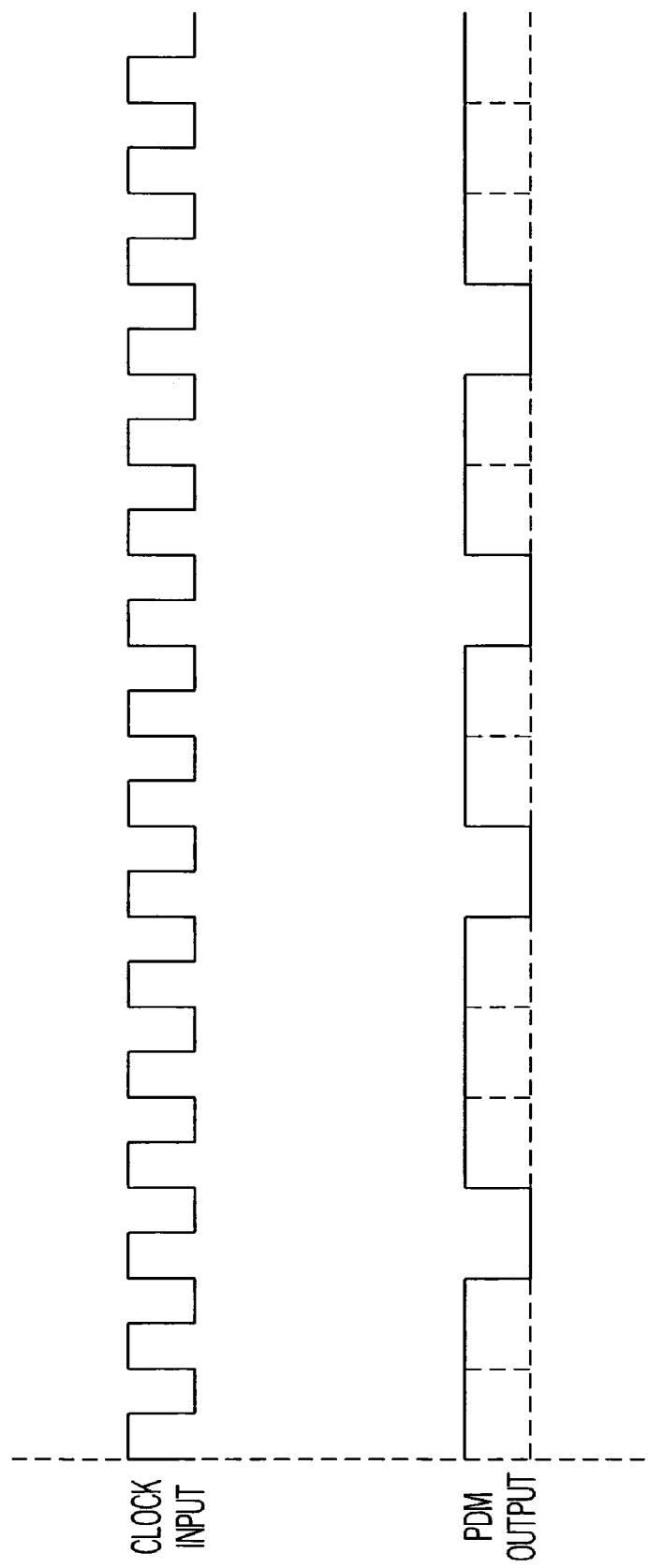
FIG. 4 is an example temporal view of the relationship between an input clock signal and the resulting pulse density modulation output generated by the method and/or system illustrated in FIG. 1 according to the data listed in FIG. 3.

FIG. 4 illustrates an example of the temporal distribution of a PDM signal generated by the system and/or method 10 of FIG. 1 using the digital input word of 179 shown in FIG. 3. As indicated by the output values indicated in FIG. 3, the PDM signal consists of two 1's followed by a 0 and, subsequently, three 1's. Likewise, the remainder of the PDM signal shown in FIG. 4 matches the rest of the output values shown in FIG. 3.

Figure 5:
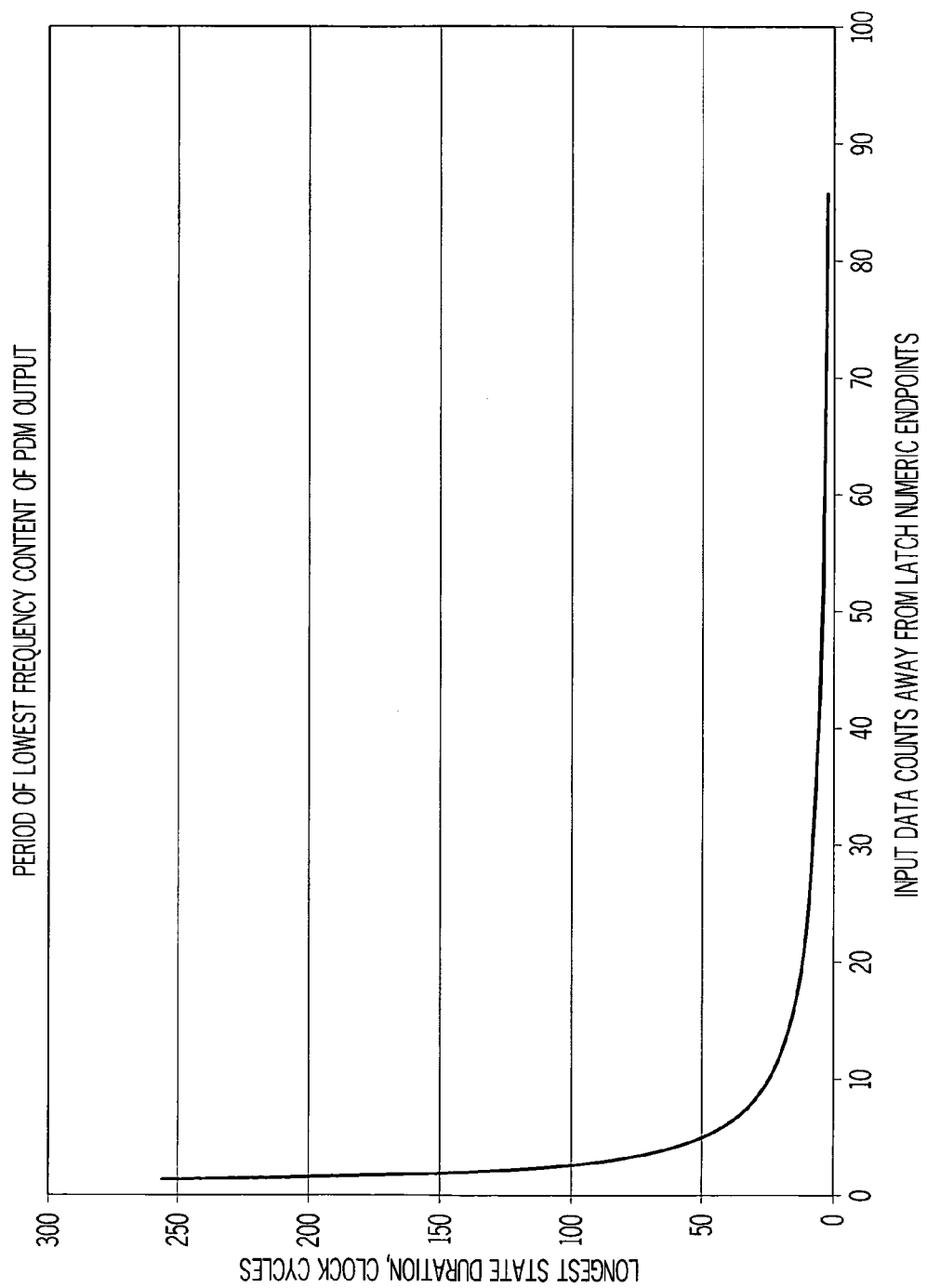
FIG. 5 is a graph illustrating maximum state duration of output pulses vs. input data according to one embodiment of the present invention.
Figure 6:
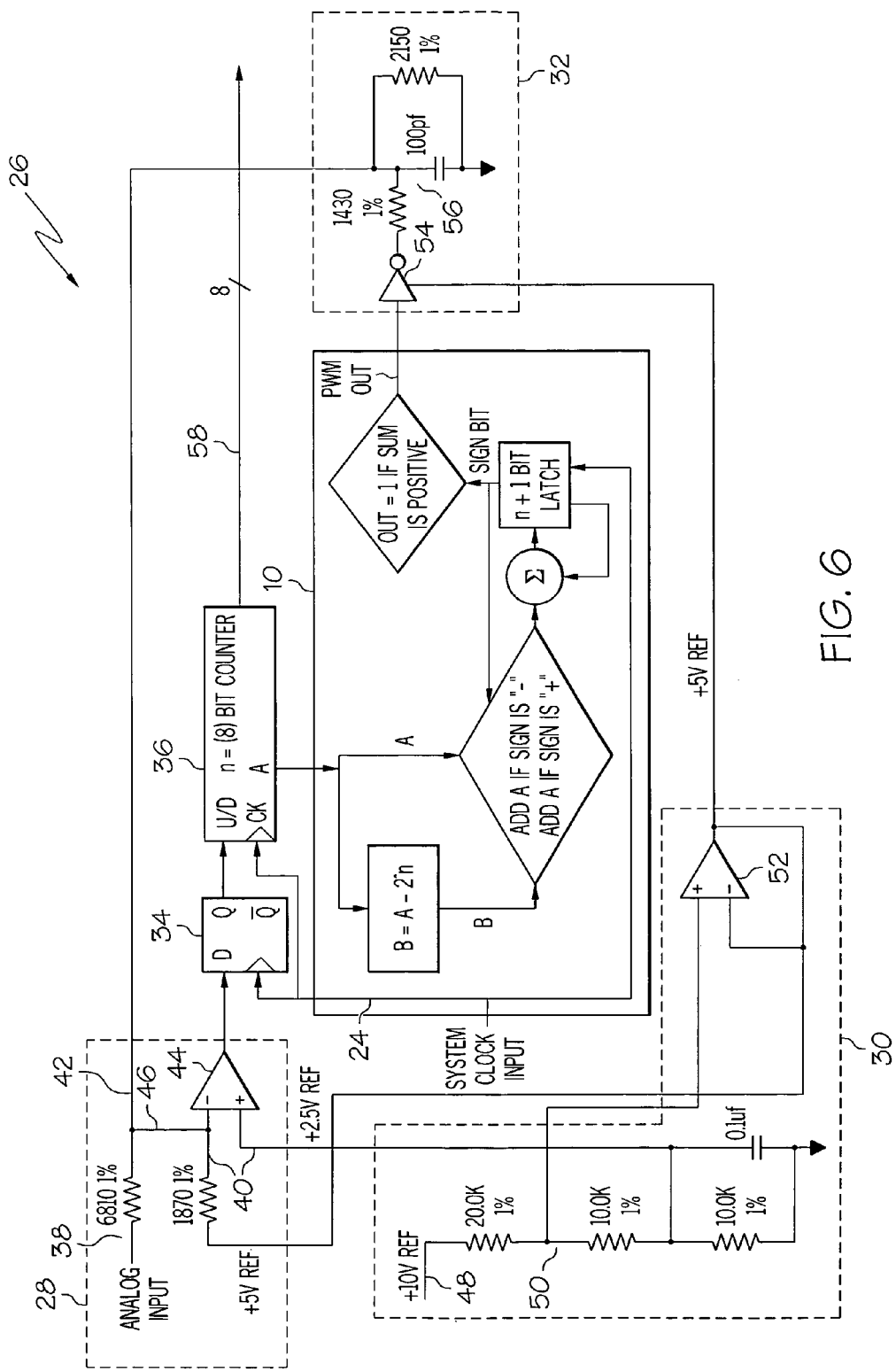
FIG. 6 is a schematic of an analog-to-digital converter circuit that utilizes the method and/or system illustrated in FIG. 1 according to one embodiment of the present invention.

FIG. 5 illustrates an example of an 8-bit PDM state duration and shows the maximum repeated state duration of the PDM output for various input data, according to one embodiment of the present invention. In particular, FIG. 5 indicates the state duration for input values approaching the numeric terminal endpoints of 0 and/or 255. As described above, in the example illustrated in FIG. 5, $2^n=256$. As shown, as the minimum numeric input approaches zero or 255, the length of the pulse grows according to a 1/x relationship. If FIG. 5 were reversed, the same effect would be mirrored about the 50% duty cycle point for the high end of the input data range. As will be described in greater detail below, a balanced optimization between the maximum length of the output pulse and the useable range of data may be obtained by limiting the numeric digital input value within a specific range of possible latch states. For example, using 25% duty cycle as a minimum and 75% duty cycle as a maximum to obtain a balanced optimization between the maximum length of output pulse (shorter is easier to filter) and the useable range of data (going from 1/16 to 15/16 for example would result in being able to use 14/16 of the data range but having a longer maximum pulse length). This is a tradeoff that the user can select from all of the available mathematical combinations as shown by the chart.

FIG. 6 illustrates an example of an implementation of the system 10. Specifically, FIG. 6 illustrates an analog-to-digital converter circuit 26 that utilizes the system 10 shown in FIG. 1 as a sub-function, according an exemplary embodiment of the present invention. The circuit 26 includes the system 10, input circuitry 28, reference voltage circuitry 30, and feedback circuitry 32. In the depicted embodiment, the system 26 also includes a "flip-flop" 34 (i.e., a logic gate) and an up/down counter 36, both of which are connected to receive the system clock signal 24. As indicated, the counter is an 8-bit counter, such that it has 256 (i.e., $2^8$) possible states. Although not specifically illustrated, the system 10 shown in FIG. 6 may include all of the components of the system 10 illustrated in FIG. 1.

The input circuitry 28 includes an analog input terminal 38, a summing node 46, two reference terminals 40, a feedback path 42, and a comparator 44. As illustrated in FIG. 5, the input terminal 38, one of the reference terminals (+5V) 40, and the feedback terminal 42 are connected at input node 46, which is connected to an input on the comparator 44. The other reference terminal (+2.5V) 40 is connected to another input on the comparator 44. An output of the comparator 44 is connected to the flip-flop 34.

The reference voltage circuitry 30 includes an input terminal (+10V) 48, a voltage divider 50, and a buffer amplifier 52. The reference input terminal 48 is connected to the voltage divider 50, which includes a series of resistors and is connected to the buffer amplifier 52. The reference voltage circuitry 30 provides reference voltages to the input circuitry 28, as well as to the feedback circuitry 32. The feedback circuitry 32 includes a switch 54, which is connected to the output of the system 10 and the +5V reference voltage from the reference voltage circuitry 30, and a low pass filter 56, that is connected to the output of the switch 54 and is depicted in this example as a conventional resistor-capacitor (RC) low-pass circuit, as is commonly understood in the art. As illustrated in FIG. 6, the output of the low pass filter 56 is connected to the feedback terminal 42. Alternate low pass filter implementations may also be substituted as desired based on their specific attributes.

In use, still referring to FIG. 6, the input terminal 38 is connected to an analog signal source. The analog signal source supplies an analog signal, such as a voltage or current, to the input circuitry 28. The comparator 44, as is generally understood, outputs a logic 1 signal to the system 10 if the sum of the input voltage and the feedback voltage is less than the 2.5V reference voltage 40. The flip-flop 34 receives the signal from the input comparator 44, and, upon receiving a clock signal, latches its state, either "high" or "low," depending on the voltage received. The state of the flip-flop is sent to the up/down counter 36 which increments its count if the state is high and decrements its count if the state is low, as is commonly understood. As illustrated in the example of FIG. 6, output 58 from the counter 36 is the resulting digital word output from analog to digital conversion system 26 as depicted . . .

As depicted in FIG. 1, the digital input word A is sent to components 12 and 14 of the system 10 where the method illustrated in FIGS. 1–4 is carried out. Before the digital word is sent to those components of the system 10, the digital word must be limited in size to a numeric value within the range of the latch when expressed in two's complement notation. In one embodiment, the digital word is limited to a range of between 25% and 75% of duty cycle range. For example, with an 8-bit latch or counter, the total number of states definable is 256. Therefore, if it is desired to limit the range between a duty cycle range of 25% to 75%, only numeric digital words with values between 64 and 192 should be sent to and processed by the system 10. This limiting may be performed using any of several different processes, as is commonly understood.

It should be noted that if the digital word "A" in FIG. 1 is limited to the range between 25% and 75% of the total number of possible states, the average output duty cycle for a constant value of A will correspondingly track between 25% and 75% of the maximum output voltage amplitude. For a specific value of A, the output will be A multiplied by the maximum output voltage divided by $2^n$. There are, for example, three typical ways applications may utilize this. The first is to use this feature "as is" where applications can accept the output range having an equivalent offset of $2^{n-1}$. In the second, an analog voltage may be subtracted from the output using a difference amplifier to eliminate the offset. Third, limiting the operating range between 25% and 75% results in only being able to use 50% of the numeric states so if the user wants $2^n$ states, the application must begin with a latch having $2^{n+1}$ possible states.

In the example shown in FIG. 6, the limiting is performed in the analog domain prior to application at the input terminal 38. Thus, the range of values that system 10 must null out is inherently limited.

Thus, referring again to FIG. 6, the digital word is received from the counter 36, converted into a PDM signal, and sent into the feedback circuitry 56. The switch, using the +5V reference voltage from the reference voltage circuitry 30, sets the maximum analog value for the feedback voltage as described in the previous comments. This essentially is a scale factor for the output amplitude such that the output voltage if simply filtered instead of being fed back would be equal to the +5V times the numeric value 58 divided by $2^n$ or $2^{n+1}$ as implemented. As will be appreciated by one skilled in the art, the intermediate PDM output is converted into an analog voltage by the low pass filter 56 and fed back via 42 to the summing node 46 as a current. Therefore, the circuit 26 performs both a tracking analog-to-digital conversion, with the output of the counter 36 being the resulting output digital signal, and an inside-the-loop digital-to-analog conversion, with the feedback signal nulling the input analog signal.

One advantage of the method and system described above is that the widths of the PDM pulses are more evenly spread in time over the averaging period. Another advantage is that because the digital input word is limited to a particular range of the total number of possible states, the ratio of the system clock frequency to the fundamental PDM output frequency is reduced. For example, when the digital input word is limited to between 25% and 75% of the total states possible, the PDM output frequency is not less than one fourth the frequency of the system clock signal. Therefore, the fidelity of the PDM signal may be improved since a shorter filter time constant may be used. As a result, the output bandwidth of the PDM signal is increased and the overall PDM updates to output signal latency is reduced. Another advantage is that the system instantaneously adjusts to changes to the digital input word synchronously with each clock cycle.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for converting a digital signal into a pulse modulation signal comprising:
   receiving a digital input signal representative of a first number;
   calculating a difference between the first number and a predetermined number to obtain a second number, the predetermined number being equal to the total number of numeric states storable within a latch function;
   calculating a summation of the first and second numbers, the summation having either a first or a second numeric sign; and
   generating a portion of a pulse modulation signal based in part on the numeric sign of the summation.

2. The method of claim 1, wherein the portion of the pulse modulation signal has a first value if a summation of the first and second numbers has the first numeric sign and the portion of the pulse modulation signal has a second value if the summation of the first and second numbers has the second numeric sign, and further comprising adding the first number to the summation if the summation has the first numeric sign and adding the second number to if the summation has the second numeric sign.

3. The method of claim 2, further comprising receiving a clock signal that instantaneously updates the pulse modulation signal to track the first number, and repeating said calculating of the difference between the first and second numbers, said generating the portion of the pulse modulation signal, and said adding of the first and second numbers to the summation at each clock cycle.

4. The method of claim 3, further comprising limiting the digital input such that the first number is between a first and second percentage of the total number of numeric states storable within the latch function.

5. The method of claim 4, wherein the first percentage is approximately 25% and the second percentage is approximately 75%.

6. The method of claim 5, wherein the first numeric sign is negative and the second numeric sign is positive.

7. The method of claim 6, wherein a duration of each portion of the pulse modulation output signal is a single clock cycle wide.

8. The method of claim 7, wherein the first value is a 1 and the second value is a 0.

9. The method of claim 8, further comprising receiving an analog input signal and converting the analog input signal into a numeric digital output.

10. The method of claim 9, further comprising converting the pulse modulation signal into an analog feedback signal and combining the feedback analog signal with the analog input signal.

11. A method for converting a digital signal into a pulse modulation signal comprising:
    receiving a digital input signal representative of a first number;
    calculating a difference between the first number and a predetermined number to obtain a second number, the predetermined number being equal to a total number of temporal states desired;
    calculating a running summation of the first and second numbers, the summation having either a first or a second numeric sign;
    adding the first number to the running summation if the running summation has the first numeric sign;
    adding the second number to the running summation if the running summation has the second numeric sign; and
    generating a portion of a pulse modulation signal based, in part, on the numeric sign of the summation, a state of the pulse modulation signal having a first value if the running summation has the first numeric sign and the state of the pulse modulation signal having a second value if the running summation has the second numeric sign.

12. The method of claim 11, further comprising limiting the digital input signal such that the first number is between a first and second percentage of the total number of temporal states.

13. The method of claim 12, wherein the first percentage is approximately 25% and the second percentage is approximately 75%.

14. The method of claim 13, wherein the first number is positive and the second number is negative.

15. The method of claim 14, further comprising receiving an analog input signal and converting the analog input signal into a numeric digital output.

16. The method of claim 15, further comprising converting the pulse modulation signal into an analog feedback signal and combining the analog feedback signal with the analog input signal.

17. The method of claim 16, further comprising receiving a clock signal, and repeating said calculating the difference between the first number and the predetermined number and said generating the portion of the pulse modulation signal at each clock cycle.

18. A method comprising:
   temporally averaging a plurality of single clock cycle wide averaging periods, each averaging period corresponding to a vector based on a plurality of first coordinates on a first axis of a two-dimensional function, the two-dimensional function further comprising a second axis having a plurality of second coordinates;
   receiving a digital input word having a numeric value, the numeric value corresponding to a vector on the second axis of the function;
   at each clock input, generating a output vector using Bresenham's Line Drawing Algorithm;
   if a cumulative error of the output function is greater than a predefined value, generating an output state having a first value; and
   if the cumulative error of the output function is less than a predefined value, generating an output state having a second value.

19. The method of claim 18, wherein said generating the output vector using Bresenham's Line Drawing Algorithm comprises:
   calculating a difference between the numeric value and a number that represents a total number of states storable in a latch function, the difference being a second number;
   conditionally adding the numeric value or the second number to a running summation based on the numeric sign of the running summation; and
   generating an output state based on the sign of the running summation.

20. The method of claim 19, wherein the first value is a 1 and the second value is a 0.

* * * * *